United States Patent
Fu

(10) Patent No.: US 10,794,951 B2
(45) Date of Patent: Oct. 6, 2020

(54) ELECTRONIC ELEMENT INSPECTION EQUIPMENT AND CHIP INSPECTION METHOD THEREOF

(71) Applicant: Winbond Electronics Corp., Taichung (TW)

(72) Inventor: Ting-Ming Fu, Xinfeng Township, Hsinchu County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 138 days.

(21) Appl. No.: 16/139,780

(22) Filed: Sep. 24, 2018

(65) Prior Publication Data
US 2020/0096562 A1 Mar. 26, 2020

(51) Int. Cl.
G01R 31/00 (2006.01)
G01R 31/28 (2006.01)
H01L 21/677 (2006.01)
B65G 29/00 (2006.01)

(52) U.S. Cl.
CPC ......... G01R 31/2893 (2013.01); B65G 29/00 (2013.01); H01L 21/67718 (2013.01); H01L 21/67721 (2013.01)

(58) Field of Classification Search
USPC ............... 324/757.01, 762.01, 71.5; 356/390
See application file for complete search history.

(56) References Cited

U.S. PATENT DOCUMENTS

| | | |
|---|---|---|
| 8,967,368 B2 | 3/2015 | Cheng et al. |
| 9,218,995 B2 | 12/2015 | Cheng et al. |
| 2007/0080703 A1 | 4/2007 | Ding |
| 2014/0239998 A1 | 8/2014 | Long et al. |
| 2019/0257876 A1* | 8/2019 | Lau .................... G01R 31/2656 |

* cited by examiner

Primary Examiner — Vincent Q Nguyen
(74) Attorney, Agent, or Firm — Muncy, Geissler, Olds & Lowe, P.C.

(57) ABSTRACT

An electronic element inspection equipment is provided, which is adapted to inspect an electronic element. The electronic element inspection equipment includes a first transmission track, a first rotational unit, a first image capturing device, a second image capturing device, a third image capturing device, a second rotational unit, a fourth image capturing device, and a second transmission track. The first rotational unit rotates around a first axis. When the first rotational unit moves the electronic element, the first image capturing device, the second image capturing device, and the third image capturing device capture images of the electronic element. The second rotational unit rotates around a second axis, wherein the second axis is perpendicular to the first axis. When the second rotational unit moves the electronic element, the fourth image capturing device captures one image of the electronic element.

20 Claims, 8 Drawing Sheets

ELECTRONIC ELEMENT INSPECTION EQUIPMENT AND CHIP INSPECTION METHOD THEREOF

BACKGROUND OF THE INVENTION

Field of the Invention

The present invention relates to electronic element inspection equipment, and in particular to electronic element inspection equipment which captures images of a chip.

Description of the Related Art

Conventionally, to capture images of a chip, the chip must be held by a vacuum nozzle that places the chip into a reflective mirror module, and images of five sides of the electronic element can be captured by a single image capturing device. The quality of the chip is judged by these images of the five sides of the electronic element. However, it takes time to place the chip into the reflective mirror module and then to remove the chip from the reflective mirror module, and inspection efficiency is decreased. Additionally, the images presented by the reflective mirror module are not complete, meaning that small defects may go unnoticed.

BRIEF SUMMARY OF THE INVENTION

In one embodiment, electronic element inspection equipment is provided, which is adapted to inspect an electronic element. The electronic element inspection equipment includes a first transmission track, a first rotational unit, a first image capturing device, a second image capturing device, a third image capturing device, a second rotational unit, a fourth image capturing device, and a second transmission track. The first rotational unit rotates around a first axis, wherein the first rotational unit is adapted to pick up the electronic element from the first track. When the first rotational unit moves the electronic element, the first image capturing device captures a first image of a first side of the electronic element, the second image capturing device captures a second image of a second side of the electronic element, the third image capturing device captures a third image of a third side of the electronic element, the second side is opposite to the third side, and the first side is perpendicular to the second side and the third side. The second rotational unit rotates around a second axis, wherein the second axis is perpendicular to the first axis, and the second rotational unit is adapted to pick up the electronic element from the first rotational unit. When the second rotational unit moves the electronic element, the fourth image capturing device captures a fourth image of a fourth side of the electronic element, the fourth side is opposite to the first side. The second rotational unit is adapted to place the electronic element to the second transmission track.

In one embodiment, the first rotational unit rotates on a first plane, the second rotational unit rotates on a second plane, the first plane is perpendicular to the second plane, and in a projection on the second plane, the first rotational unit is arranged in a radial direction of the second rotational unit.

In one embodiment, the electronic element inspection equipment further comprises a fifth image capturing device and a sixth image capturing device, when the second rotational unit moves the electronic element, the fifth image capturing device captures a fifth image of a fifth side of the electronic element, the sixth image capturing device captures a sixth image of a sixth side of the electronic element, the fifth side is opposite to the sixth side, and the fifth side is perpendicular to the first side and the second side.

In one embodiment, the first rotational unit rotates on a first plane, the second rotational unit rotates on a second plane, the first plane is perpendicular to the second plane, and in a projection on the second plane, the first rotational unit is arranged on a tangent line of the second rotational unit.

In one embodiment, the first rotational unit comprises a plurality of first nozzles, the first nozzles are arranged along a circumferential direction of the first rotational unit and are located on a lateral side of the first rotational unit, one of the first nozzles picks up the electronic element in a first holding direction, and the first holding direction extends in a radial direction of the first rotational unit.

In one embodiment, the second rotational unit comprises a plurality of second nozzles, the second nozzles are arranged along a circumferential direction of the second rotational unit and are located on the bottom side of the second rotational unit, one of the second nozzles picks up the electronic element in a second holding direction, and the second holding direction is parallel to the second axis.

In one embodiment, one of the first nozzles holds the fourth side of the electronic element, and one of the second nozzles holds the first side of the electronic element.

In one embodiment, the electronic element comprises a plurality of pins, and the pins are formed on the second side and the third side of the electronic element.

In one embodiment, the electronic element inspection equipment further comprises an electrical inspection station and a carrier unit, wherein after the electronic element is inspected by the electrical inspection station, the electronic element is placed on the carrier unit, and the electronic element is further picked up from the carrier unit to be placed on the first transmission track.

In one embodiment, after the electronic element is inspected by the electrical inspection station, the electronic element is placed on the carrier unit, the carrier unit is rotated 180 degrees, and then the electronic element is picked up from the carrier unit to be placed on the first transmission track.

In another embodiment, a chip inspection method is provided, which is adapted to inspect an electronic element. The chip inspection method includes the following steps. First, a first transmission track, a first rotational unit, a first image capturing device, a second image capturing device, a third image capturing device, a second rotational unit, a fourth image capturing device and a second transmission track are provided. Then, the electronic element is picked up from the first track by the first rotational unit. Next, a first image of a first side of the electronic element is captured by the first image capturing device, a second image of a second side of the electronic element is captured by the second image capturing device, a third image of a third side of the electronic element is captured by the third image capturing device when the first rotational unit moves the electronic element. The second side is opposite to the third side, and the first side is perpendicular to the second side and the third side. Then, the electronic element is picked up from the first rotational unit by the second rotational unit. Next, a fourth image of a fourth side of the electronic element is captured by the fourth image capturing device, when the second rotational unit moves the electronic element, wherein the fourth side is opposite to the first side. Then, the electronic element is placed on the second transmission track by the second rotational unit, wherein the first rotational unit rotates around a first axis, the second rotational unit rotates around a second axis, and the second axis is perpendicular to the first axis.

In one embodiment, the chip inspection method further comprises the following steps. First, an electrical inspection station and a carrier unit are provided, wherein after the electronic element is inspected by the electrical inspection station, the electronic element is placed on the carrier unit. Next, the carrier unit is rotated 180 degrees. Then, the electronic element is picked up from the carrier unit to be placed on the first transmission track.

Utilizing the electronic element inspection equipment of the embodiment of the invention, the images of the electronic element are captured during the electronic element being moved by the first rotational unit and the second rotational unit. Therefore, the inspection time is reduced, and the inspection efficiency is improved. Additionally, the images of the six sides of the electronic element are captured. Therefore, the small-sized defect can also be inspected.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
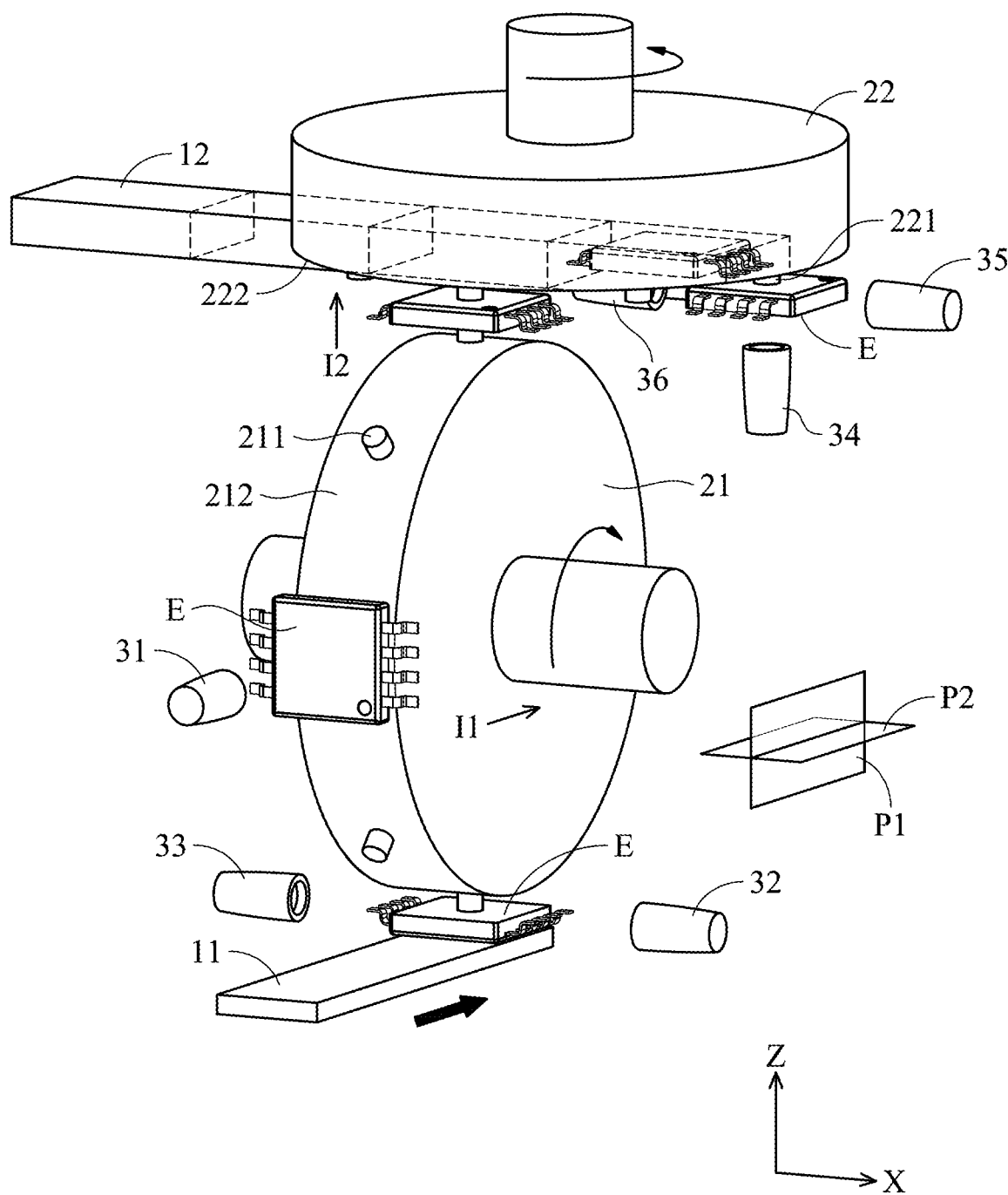
FIG. 1 shows an electronic element inspection equipment of an embodiment of the invention.

FIG. 1 shows an electronic element inspection equipment of an embodiment of the invention. With reference to FIG. 1, the electronic element inspection equipment D of the embodiment of the invention is adapted to inspect an electronic element E. The electronic element inspection equipment D includes a first transmission track 11, a first rotational unit 21, a first image capturing device 31, a second image capturing device 32, a third image capturing device 33, a second rotational unit 22, a fourth image capturing device 34 and a second transmission track 12. The first rotational unit 21 rotates around a first axis X. The first rotational unit 21 is adapted to pick up the electronic element E from the first track 11. When the first rotational unit 21 moves the electronic element E, the first image capturing device 31 captures a first image of a first side of the electronic element E, the second image capturing device 32 captures a second image of a second side of the electronic element E, the third image capturing device 33 captures a third image of a third side of the electronic element E. In this embodiment, the electronic element E can be a chip.

With reference to FIG. 1, the second rotational unit 22 rotates around a second axis Z. The second axis Z is perpendicular to the first axis X. The second rotational unit 22 is adapted to pick up the electronic element E from the first rotational unit 21. When the second rotational unit 22 moves the electronic element E, the fourth image capturing device 34 captures a fourth image of a fourth side of the electronic element E. The second rotational unit 22 is adapted to place the electronic element E to the second transmission track 12.

Figure 2A:
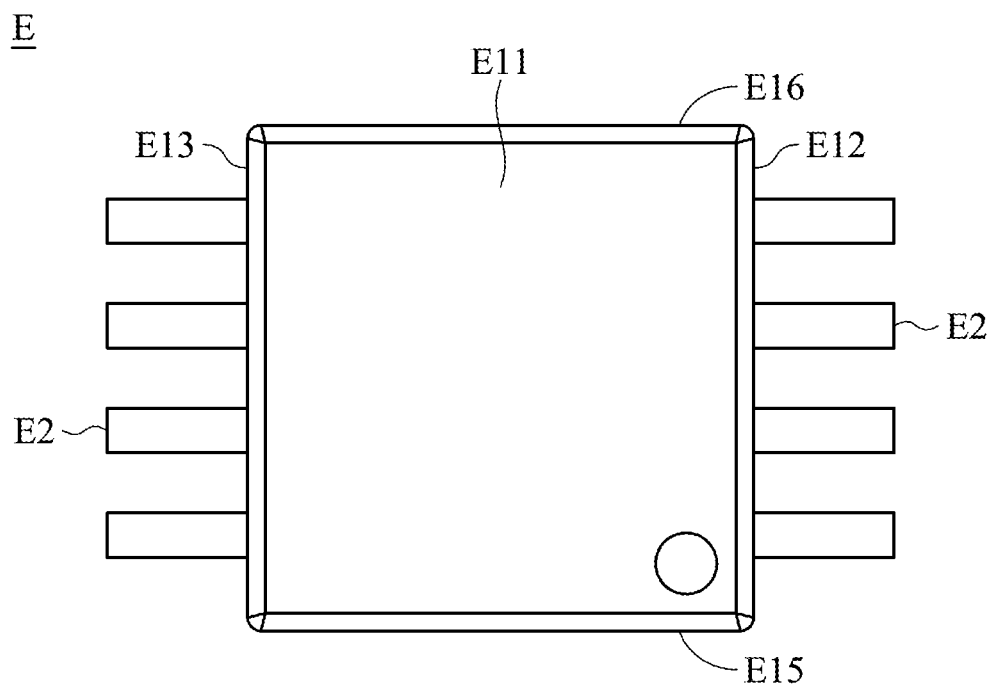
FIG. 2A is a top view of the electronic element of the embodiment of the invention.
Figure 2B:
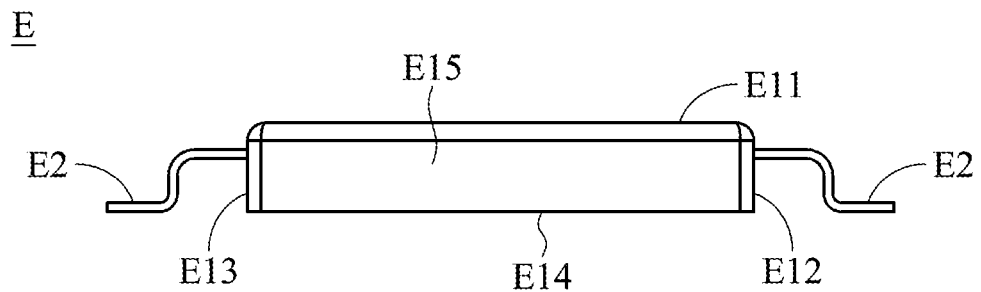
FIG. 2B is a side view of the electronic element of the embodiment of the invention.

FIG. 2A is a top view of the electronic element E of the embodiment of the invention. FIG. 2B is a side view of the electronic element E of the embodiment of the invention. With reference to FIGS. 2A and 2B, the second side E12 of the electronic element E is opposite to the third side E13 of the electronic element E. The first side E11 of the electronic element E is perpendicular to the second side E12 and the third side E13. The fourth side E 14 of the electronic element E is opposite to the first side E11.

Figure 3:
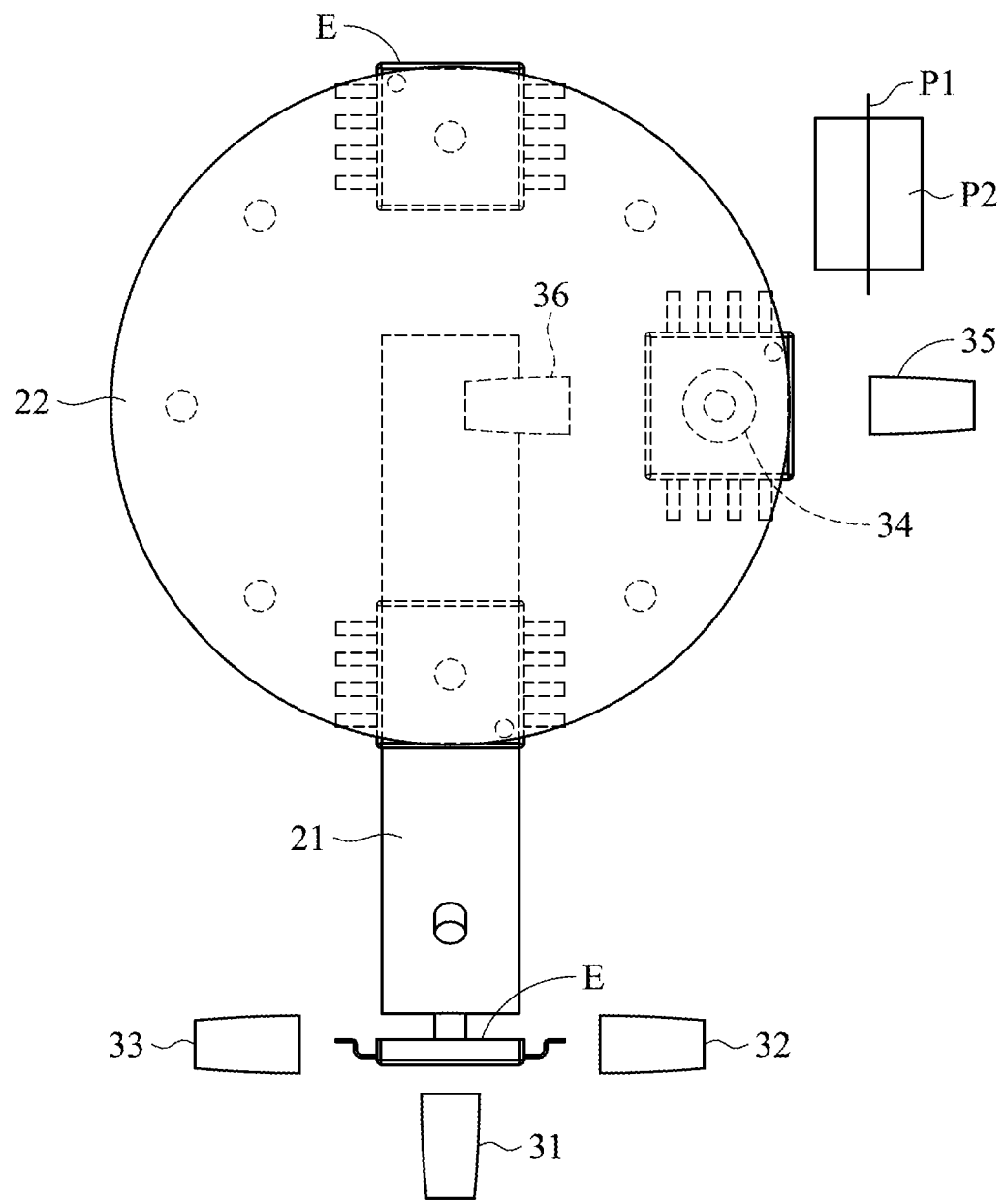
FIG. 3 shows the arrangement of a first rotational unit and a second rotational unit of the first embodiment of the invention.

With reference to FIG. 1, in one embodiment, the first rotational unit 21 rotates on a first plane P1, and the second rotational unit 22 rotates on a second plane P2. The first plane P1 is perpendicular to the second plane P2. With reference to FIG. 3, in a first embodiment, in a projection on the second plane P2, the first rotational unit 21 is arranged in a radial direction of the second rotational unit 22.

With reference to FIG. 1, in one embodiment, the electronic element inspection equipment D further comprises a fifth image capturing device 35 and a sixth image capturing device 36. When the second rotational unit 22 moves the electronic element E, the fifth image capturing device 35 captures a fifth image of a fifth side E15 of the electronic element E, the sixth image capturing device 36 captures a sixth image of a sixth side E16 of the electronic element E. The fifth side E15 is opposite to the sixth side E16, and the fifth side E15 is perpendicular to the first side E11 and the second side E12.

In the first embodiment of the invention, in the projection on the second plane P2, the first rotational unit 21 is arranged in the radial direction of the second rotational unit 22. Therefore, the fifth image capturing device 35 and the sixth image capturing device 36 can be properly arranged, and are prevented from being interference with the first rotational unit 21, the second rotational unit 22 or the electronic element E. The fifth image of the fifth side E15 and the sixth image of the sixth side E16 can be captured. For example, the fifth image capturing device 35 and the sixth image capturing device 36 can be arranged on the radial direction of the second rotational plate 22 to capture the fifth image of the fifth side E15 and the sixth image of the sixth side E16.

Figure 4:
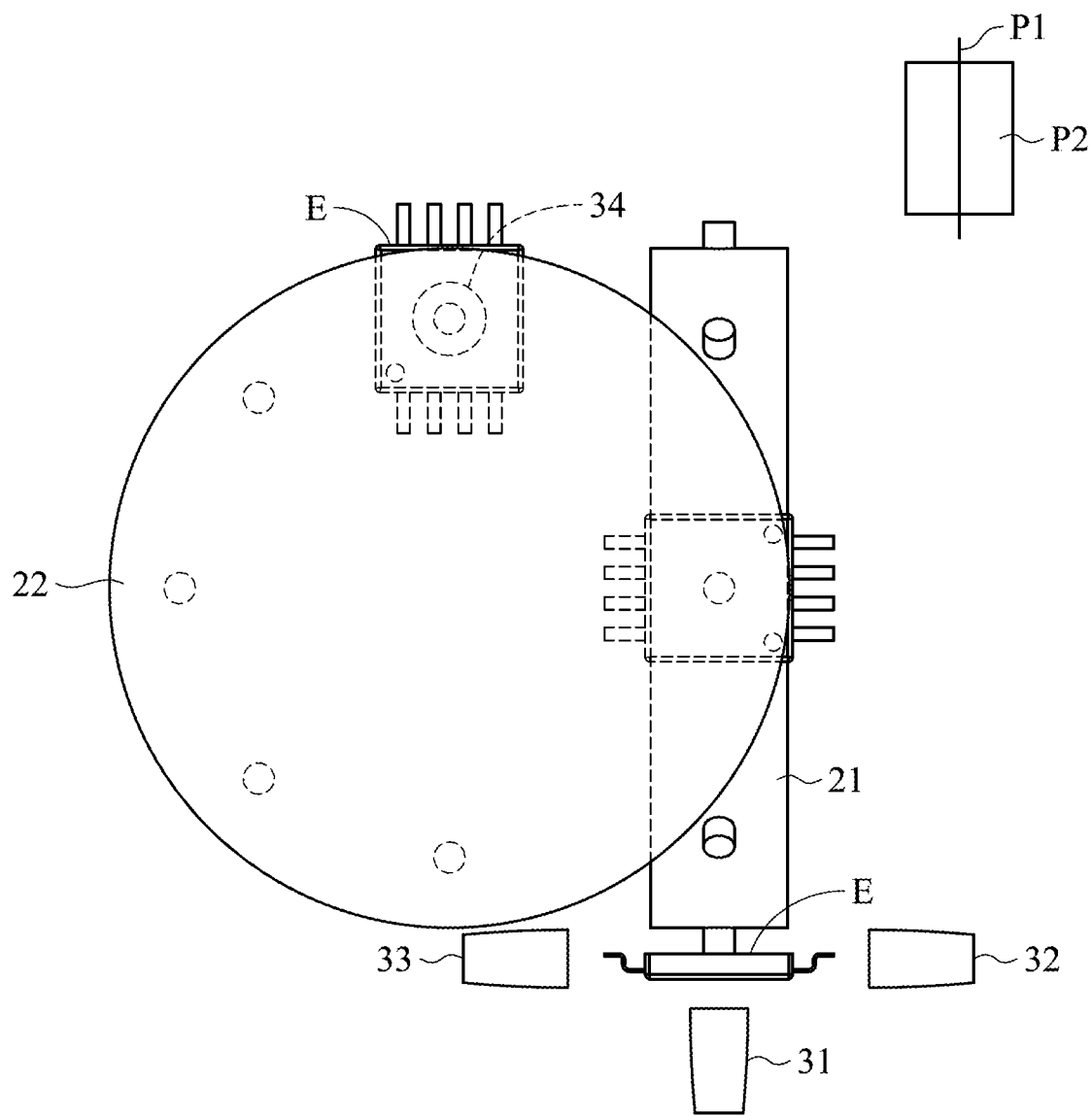
FIG. 4 shows the arrangement of the first rotational unit and the second rotational unit of the second embodiment of the invention.

FIG. 4 shows the arrangement of the first rotational unit and the second rotational unit of the second embodiment of the invention. With reference to FIG. 4, in the second embodiment, the first rotational unit 21 rotates on a first plane P1, and the second rotational unit 22 rotates on a second plane P2. The first plane P1 is perpendicular to the second plane P2. In a projection on the second plane P2, the first rotational unit 21 is arranged on a tangent line of the second rotational unit 22. In the arrangement of the second embodiment of the invention, the fifth image capturing device 35 and the sixth image capturing device 36 are omitted, and the electronic element inspection equipment D only captures the first image, the second image, the third image and the fourth image of the electronic element.

With reference to FIG. 1, in one embodiment, the first rotational unit 21 comprises a plurality of first nozzles 211. The first nozzles 211 are arranged along a circumferential direction of the first rotational unit 21 and are located on a lateral side 212 of the first rotational unit 21. One of the first nozzles 211 picks up the electronic element R in a first holding direction I1, and the first holding direction I1 extends in a radial direction of the first rotational unit 21.

With reference to FIG. 1, in one embodiment, the second rotational unit 22 comprises a plurality of second nozzles 221. The second nozzles 221 are arranged along a circumferential direction of the second rotational unit 22 and are located on the bottom side 222 of the second rotational unit 22. One of the second nozzles 221 picks up the electronic element E in a second holding direction I2, and the second holding direction I2 is parallel to the second axis Z.

With reference to FIG. 1, in one embodiment, one of the first nozzles 211 holds the fourth side E14 of the electronic element E, and one of the second nozzles 221 holds the first side E11 of the electronic element E.

With reference to FIGS. 2A and 2B, in one embodiment, the electronic element E comprises a plurality of pins E2, and the pins E2 are formed on the second side E12 and the third side E13 of the electronic element E.

Figure 5A:
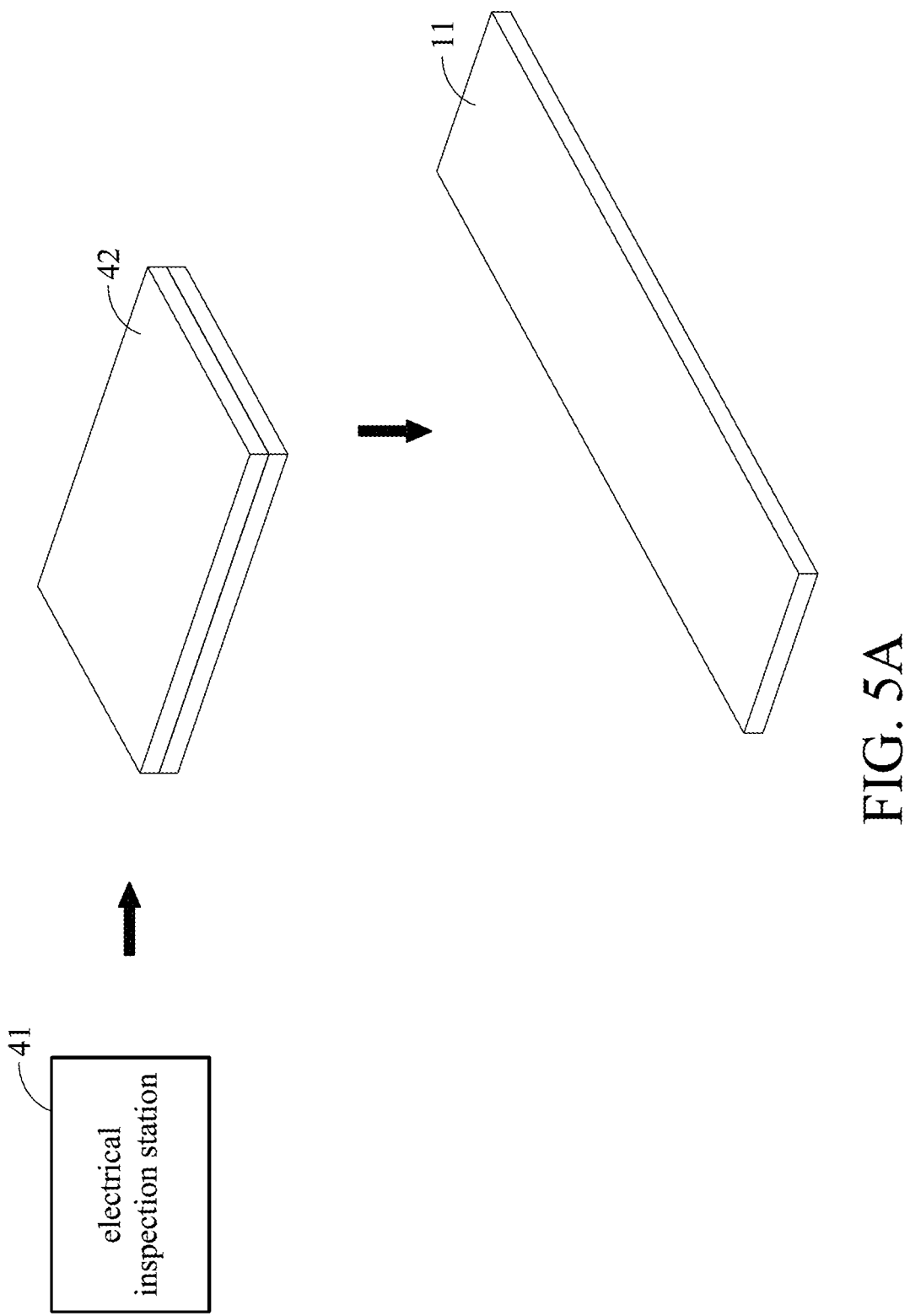
FIG. 5A shows an electrical inspection station and a carrier unit of the embodiment of the invention.

With reference to FIG. 5A, in one embodiment, the electronic element inspection equipment D further comprises an electrical inspection station 41 and a carrier unit 42. After the electronic element E is inspected by the electrical inspection station 41, the electronic element E is placed on the carrier unit 42. The carrier unit 42 is moved adjacent to the first transmission track 11. Then, the electronic element E is picked up from the carrier unit 42 to be placed on the first transmission track 11.

Figure 5B:
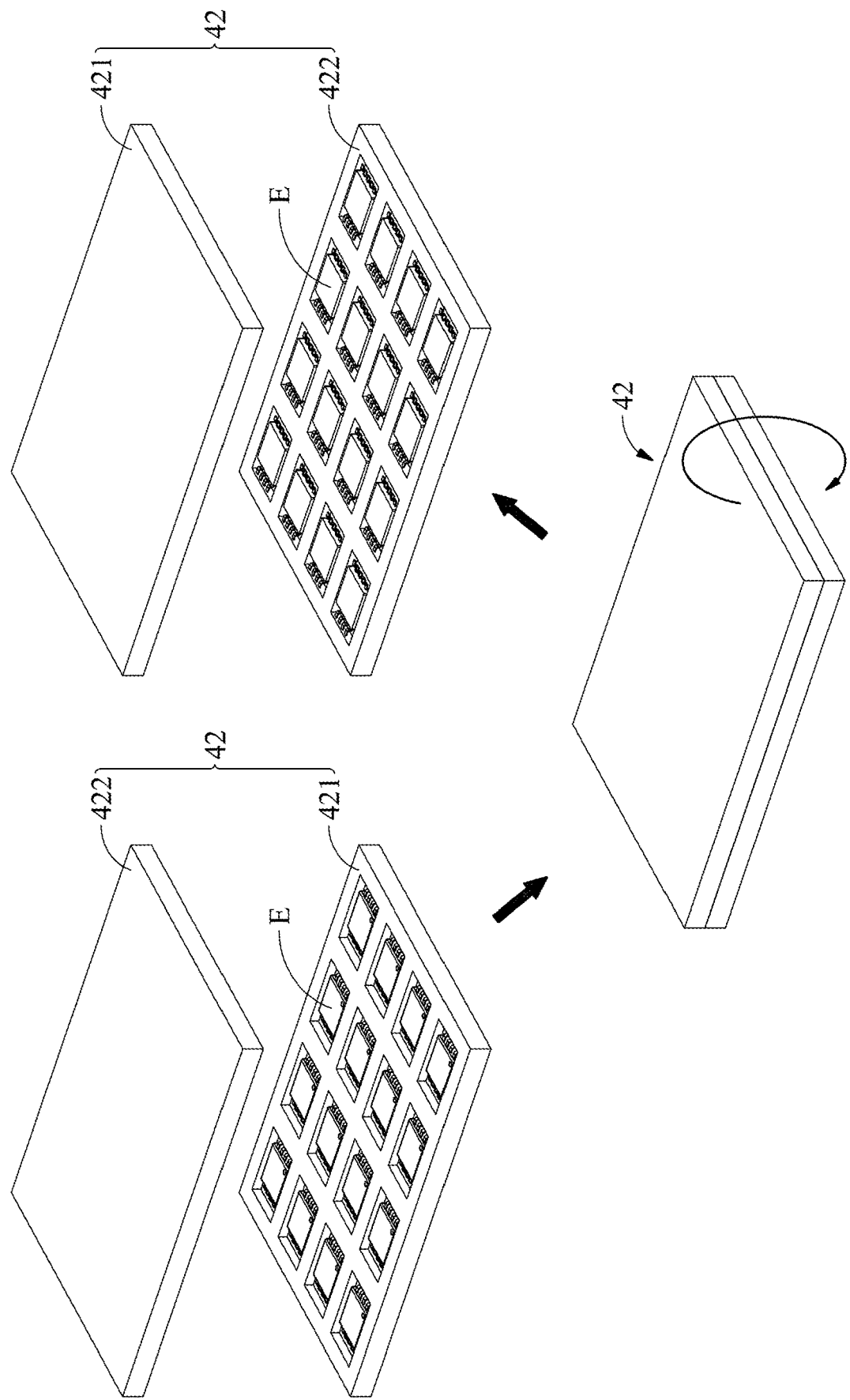
FIG. 5B shows the carrier unit of the embodiment of the invention rotating the electronic element.

With reference to FIGS. 5A and 5B, in one embodiment, the carrier unit 42 comprises a first carrier 421 and a second carrier 422. In one embodiment, after the electronic element E is inspected by the electrical inspection station 41, the electronic element E is placed on the first carrier 421. Then, the carrier unit 42 is rotated 180 degrees. Next, the electronic element E is picked up from the second carrier 422 to be placed on the first transmission track 11. Then, the first rotational unit 21 picks up the electronic element E directly.

Figure 6A:
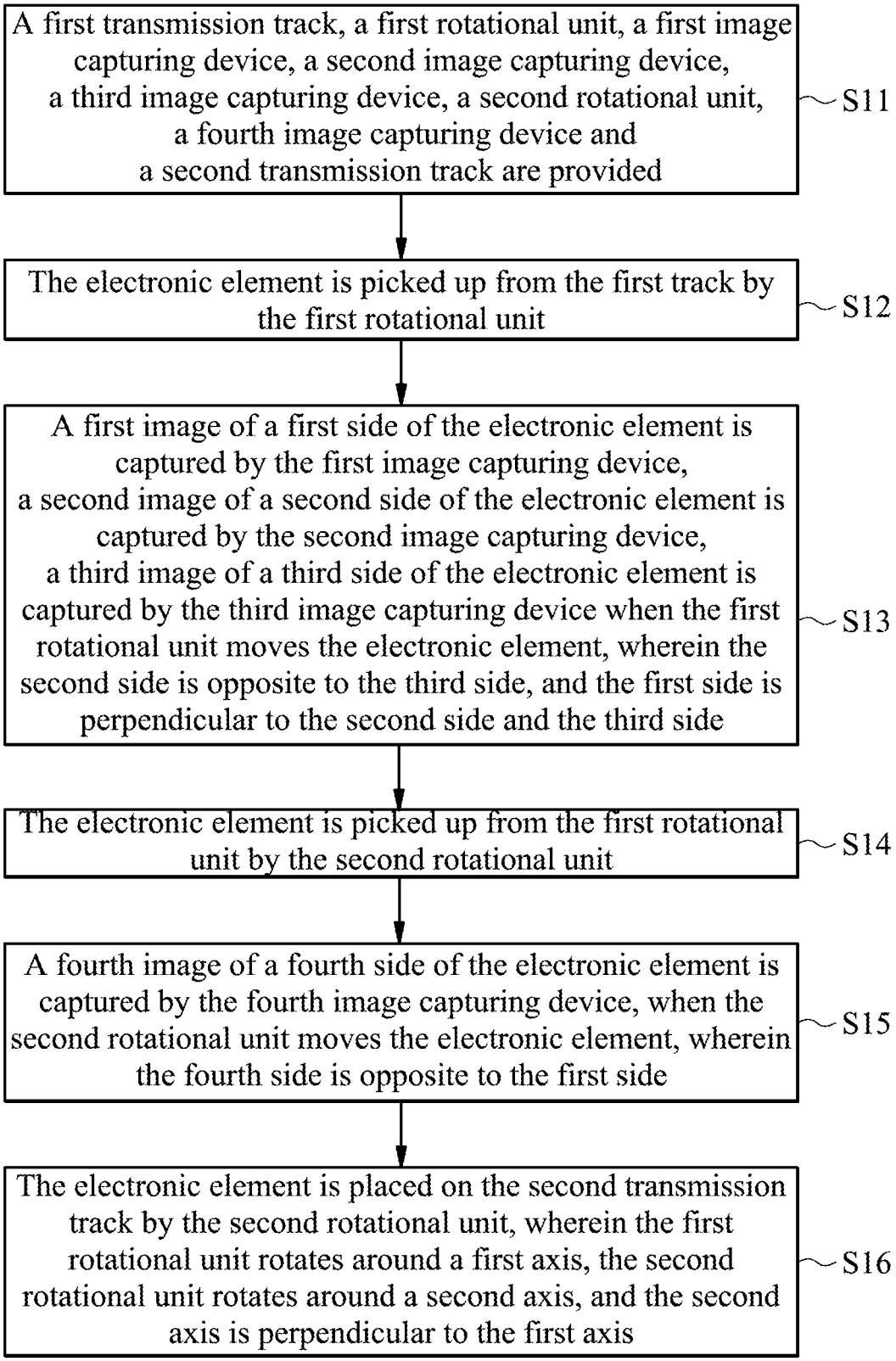
FIGS. 6A and 6B show a chip inspection method of the embodiment of the invention.
Figure 6B:
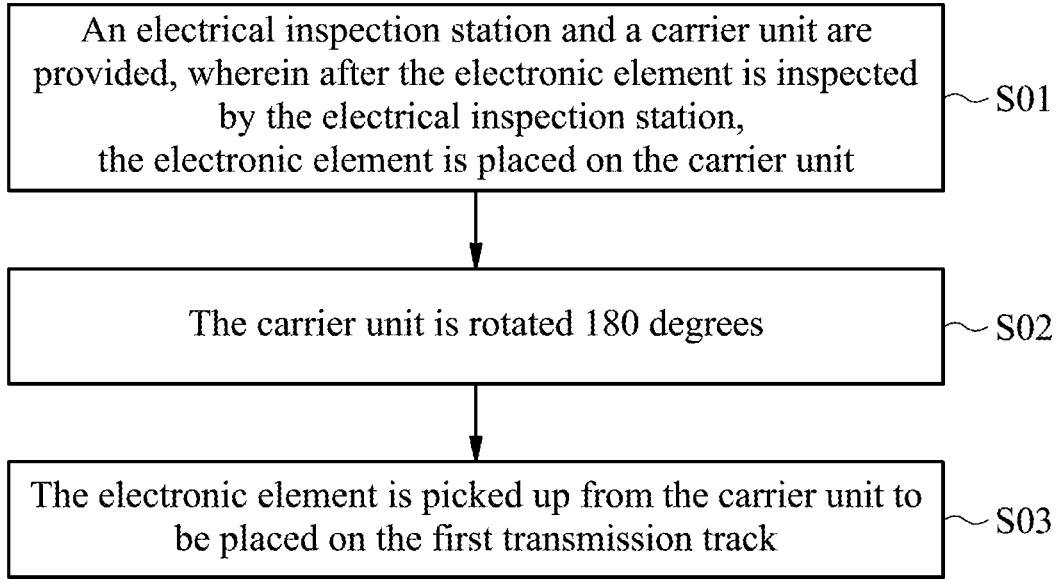

With reference to FIG. 6A, in another embodiment, a chip inspection method is provided, which is adapted to inspect an electronic element. The chip inspection method includes the following steps. First, a first transmission track, a first rotational unit, a first image capturing device, a second image capturing device, a third image capturing device, a second rotational unit, a fourth image capturing device and a second transmission track are provided (S11). Then, the electronic element is picked up from the first track by the first rotational unit (S12). Next, a first image of a first side of the electronic element is captured by the first image capturing device, a second image of a second side of the electronic element is captured by the second image capturing device, a third image of a third side of the electronic element is captured by the third image capturing device when the first rotational unit moves the electronic element, wherein the second side is opposite to the third side, and the first side is perpendicular to the second side and the third side (S13). Then, the electronic element is picked up from the first rotational unit by the second rotational unit (S14). Next, a fourth image of a fourth side of the electronic element is captured by the fourth image capturing device, when the second rotational unit moves the electronic element, wherein the fourth side is opposite to the first side (S15). Then, the electronic element is placed on the second transmission track by the second rotational unit, wherein the first rotational unit rotates around a first axis, the second rotational unit rotates around a second axis, and the second axis is perpendicular to the first axis (S16).

In one embodiment, the chip inspection method further comprises the following steps. First, an electrical inspection station and a carrier unit are provided, wherein after the electronic element is inspected by the electrical inspection station, the electronic element is placed on the carrier unit (S01). Next, the carrier unit is rotated 180 degrees (S02). Then, the electronic element is picked up from the carrier unit to be placed on the first transmission track (S03).

Utilizing the electronic element inspection equipment of the embodiment of the invention, the images of the electronic element are captured during the electronic element being moveted by the first rotational unit and the second rotational unit, Therefore, inspection time is reduced, and the inspection efficiency is improved. Additionally, the images of the six sides of the electronic element are captured. Therefore, the small-sized defect can also be inspected.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic element inspection equipment, adapted to inspect an electronic element, comprising:
    a first transmission track;
    a first rotational unit, rotating around a first axis, wherein the first rotational unit is adapted to pick up the electronic element from the first track;
    a first image capturing device, wherein when the first rotational unit moves the electronic element, the first image capturing device captures a first image of a first side of the electronic element;
    a second image capturing device, wherein when the first rotational unit moves the electronic element, the second image capturing device captures a second image of a second side of the electronic element;
    a third image capturing device, wherein when the first rotational unit moves the electronic element, the third image capturing device captures a third image of a third side of the electronic element, the second side is opposite to the third side, and the first side is perpendicular to the second side and the third side;

a second rotational unit, rotating around a second axis, wherein the second axis is perpendicular to the first axis, and the second rotational unit is adapted to pick up the electronic element from the first rotational unit;

a fourth image capturing device, wherein when the second rotational unit moves the electronic element, the fourth image capturing device captures a fourth image of a fourth side of the electronic element, the fourth side is opposite to the first side; and a second transmission track, wherein the second rotational unit is adapted to place the electronic element to the second transmission track, wherein the first rotational unit rotates on a first plane, the second rotational unit rotates on a second plane, and the first plane is perpendicular to the second plane.

2. The electronic element inspection equipment as claimed in claim 1, wherein in a projection on the second plane, the first rotational unit is arranged in a radial direction of the second rotational unit.

3. The electronic element inspection equipment as claimed in claim 1, further comprising a fifth image capturing device and a sixth image capturing device, when the second rotational unit moves the electronic element, the fifth image capturing device captures a fifth image of a fifth side of the electronic element, the sixth image capturing device captures a sixth image of a sixth side of the electronic element, the fifth side is opposite to the sixth side, and the fifth side is perpendicular to the first side and the second side.

4. The electronic element inspection equipment as claimed in claim 1, wherein in a projection on the second plane, the first rotational unit is arranged on a tangent line of the second rotational unit.

5. The electronic element inspection equipment as claimed in claim 1, wherein the first rotational unit comprises a plurality of first nozzles, the first nozzles are arranged along a circumferential direction of the first rotational unit and are located on a lateral side of the first rotational unit, one of the first nozzles picks up the electronic element in a first holding direction, and the first holding direction extends in a radial direction of the first rotational unit.

6. The electronic element inspection equipment as claimed in claim 5, wherein the second rotational unit comprises a plurality of second nozzles, the second nozzles are arranged along a circumferential direction of the second rotational unit and are located on a bottom side of the second rotational unit, one of the second nozzles picks up the electronic element in a second holding direction, and the second holding direction is parallel to the second axis.

7. The electronic element inspection equipment as claimed in claim 6, wherein one of the first nozzles holds the fourth side of the electronic element, and one of the second nozzles holds the first side of the electronic element.

8. The electronic element inspection equipment as claimed in claim 7, wherein the electronic element comprises a plurality of pins, and the pins are formed on the second side and the third side of the electronic element.

9. The electronic element inspection equipment as claimed in claim 7, further comprising an electrical inspection station and a carrier unit, wherein after the electronic element is inspected by the electrical inspection station, the electronic element is placed on the carrier unit, and the electronic element is further picked up from the carrier unit to be placed on the first transmission track.

10. The electronic element inspection equipment as claimed in claim 9, wherein after the electronic element is inspected by the electrical inspection station, the electronic element is placed in the carrier unit, the carrier unit is rotated 180 degrees, and then the electronic element is picked up from the carrier unit to be placed on the first transmission track.

11. A chip inspection method, adapted to inspect an electronic element, comprising:

providing a first transmission track, a first rotational unit, a first image capturing device, a second image capturing device, a third image capturing device, a second rotational unit, a fourth image capturing device and a second transmission track picking up the electronic element from the first track by the first rotational unit;

capturing a first image of a first side of the electronic element by the first image capturing device when the first rotational unit moves the electronic element;

capturing a second image of a second side of the electronic element by the second image capturing device when the first rotational unit moves the electronic element;

capturing a third image of a third side of the electronic element by the third image capturing device when the first rotational unit moves the electronic element, wherein the second side is opposite to the third side, and the first side is perpendicular to the second side and the third side;

picking up the electronic element from the first rotational unit by the second rotational unit;

capturing a fourth image of a fourth side of the electronic element by the fourth image capturing device when the second rotational unit moves the electronic element, wherein the fourth side is opposite to the first side; and placing the electronic element on the second transmission track by the second rotational unit, wherein the first rotational unit rotates around a first axis, the second rotational unit rotates around a second axis, and the second axis is perpendicular to the first axis, wherein the first rotational unit rotates on a first plane, the second rotational unit rotates on a second plane, and the first plane is perpendicular to the second plane.

12. The chip inspection method as claimed in claim 11, further comprising providing an electrical inspection station and a carrier unit, wherein after the electronic element is inspected by the electrical inspection station, the electronic element is placed on the carrier unit, and the electronic element is further picked up from the carrier unit to be placed on the first transmission track.

13. The chip inspection method as claimed in claim 12, wherein after the electronic element is inspected by the electrical inspection station, the electronic element is placed on the carrier unit, the carrier unit is rotated 180 degrees, and then the electronic element is picked up from the carrier unit to be placed on the first transmission track.

14. The chip inspection method as claimed in claim 11, wherein in a projection on the second plane, the first rotational unit is arranged in a radial direction of the second rotational unit.

15. The chip inspection method as claimed in claim 14, further comprising a fifth image capturing device and a sixth image capturing device, and when the second rotational unit moves the electronic element, the fifth image capturing device captures a fifth image of a fifth side of the electronic element, the sixth image capturing device captures a sixth image of a sixth side of the electronic element, the fifth side is opposite to the sixth side, and the fifth side is perpendicular to the first side and the second side.

16. The chip inspection method as claimed in claim 11, wherein in a projection on the second plane, the first rotational unit is arranged on a tangent line of the second rotational unit.

17. The chip inspection method as claimed in claim 11, wherein the first rotational unit comprises a plurality of first nozzles, the first nozzles are arranged along a circumferential direction of the first rotational unit and are located on a lateral side of the first rotational unit, one of the first nozzles picks up the electronic element in a first holding direction, and the first holding direction extends in a radial direction of the first rotational unit.

18. The chip inspection method as claimed in claim 17, wherein the second rotational unit comprises a plurality of second nozzles, the second nozzles are arranged along a circumferential direction of the second rotational unit and are located on the bottom side of the second rotational unit, one of the second nozzles picks up the electronic element in a second holding direction, and the second holding direction is parallel to the second axis.

19. The chip inspection method as claimed in claim 18, wherein one of the first nozzles holds the fourth side of the electronic element, and one of the second nozzles holds the first side of the electronic element.

20. The chip inspection method as claimed in claim 19, wherein the electronic element comprises a plurality of pins, and the pins are formed on the second side and the third side of the electronic element.

* * * * *